United States Patent [19]

Kawakami et al.

[11] Patent Number: 5,296,043

[45] Date of Patent: Mar. 22, 1994

[54] MULTI-CELLS INTEGRATED SOLAR CELL MODULE AND PROCESS FOR PRODUCING THE SAME

[75] Inventors: Soichiro Kawakami, Hikone; Kimitoshi Fukae, Yokohama, both of Japan

[73] Assignee: Canon Kabushiki Kaisha, Tokyo, Japan

[21] Appl. No.: 980,115

[22] Filed: Nov. 23, 1992

Related U.S. Application Data

[63] Continuation of Ser. No. 853,844, Mar. 19, 1992, abandoned, which is a continuation of Ser. No. 656,010, Feb. 15, 1991, abandoned.

[30] Foreign Application Priority Data

Feb. 16, 1990 [JP] Japan ................. 2-35271

[51] Int. Cl.⁵ .................. H01L 31/05; H01L 31/18
[52] U.S. Cl. .................. 136/244; 437/2; 437/4; 437/51; 437/205
[58] Field of Search .......... 136/244; 437/2-5, 437/51, 205

[56] References Cited

U.S. PATENT DOCUMENTS

| | | | |
|---|---|---|---|
| 3,527,619 | 9/1970 | Miley | 136/244 |
| 4,758,526 | 7/1988 | Thalheimer | 437/2 |
| 4,879,251 | 11/1989 | Kruehler et al. | 437/4 |

*Primary Examiner*—Aaron Weisstuch
*Attorney, Agent, or Firm*—Fitzpatrick, Cella, Harper & Scinto

[57] ABSTRACT

An improved solar cell module is provided comprising a plurality of solar cell elements, each comprising a semiconductor layer and an upper electrode disposed in this order on the conductive surface of a substrate. This plurality of solar cell elements are spacedly disposed on a common, electrically insulative base member, with each solar cell element electrically connected in series with its adjacent element. An insulating material is disposed in the space between the solar cell elements in each pair of adjacent solar cell elements and a conductor formed of a conductive paste is disposed on the insulating material, such that one end of the conductor is electrically connected to the conductive substrate surface of one solar cell element, and the other end of the conductor is electrically connected to the upper electrode of the adjacent solar cell element. A process for producing the above solar cell module is also provided.

8 Claims, 4 Drawing Sheets

MULTI-CELLS INTEGRATED SOLAR CELL MODULE AND PROCESS FOR PRODUCING THE SAME

This application is a continuation of application Ser. No. 07/853,844 filed on Mar. 19, 1992, now abandoned, which is a continuation application of prior application Ser. No. 07/656,010 filed on Feb. 15, 1991, now abandoned.

FIELD OF THE INVENTION

The present invention relates to an improved solar cell module comprising a plurality of solar cell elements integrated with the use of a conductive paste, and to a process for producing the solar cell module.

BACKGROUND OF THE INVENTION

In recent years, heating of the earth because of the so-called greenhouse effect, due to an increase in atmospheric $CO_2$, has been predicted. As a result, there has been an increased demand for a means of power generation capable of providing clean energy without causing $CO_2$ build-up. Nuclear power is advantageous in this regard, since its generation does not cause a build-up of $CO_2$. However, nuclear power unavoidably creates radioactive wastes harmful to living things. Moreover, there is a probability that injurious radioactive materials will leak from a nuclear power generation system if it is damaged. Accordingly, there is an increased societal demand for a power generation system capable of providing clean energy without causing $CO_2$ build-up, as is the case with thermal power generation, and without causing radioactive wastes and radioactive materials, as is the case with nuclear power generation.

Various proposals have been made to meet this demand. Among those proposals, solar cells are expected to be a future power generation source, since they supply electric power without causing the problems mentioned above.

A number of proposals have already been made for solar cells. In addition, various studies have been made on the constituent semiconductor films, from the viewpoints of reproducibility, productivity, production cost, etc. For example, extensive studies have been made on inorganic and organic semiconductor films, particularly on non-single crystal semiconductor films of amorphous silicon (a-Si) or polycrystal silicon (poly-Si). These non-single crystal semiconductor films can be formed in a large area with a relatively low production cost.

When solar cells are used for power generation, a plurality of solar cell elements are integrated to form a solar cell module. Each solar cell element comprises one or more semiconductor films laminated on a conductive substrate. In addition to the constituent semiconductor films, the substrate is also an important factor, since it will determine properties such as shock resistance, flexibility, and the like.

Moreover, it is necessary to integrate a number of solar cell elements with one another while electrically connecting them in series. The solar cell elements are required to be electrically connected in series such that their conductive substrates do not contact each other.

Figure 1:
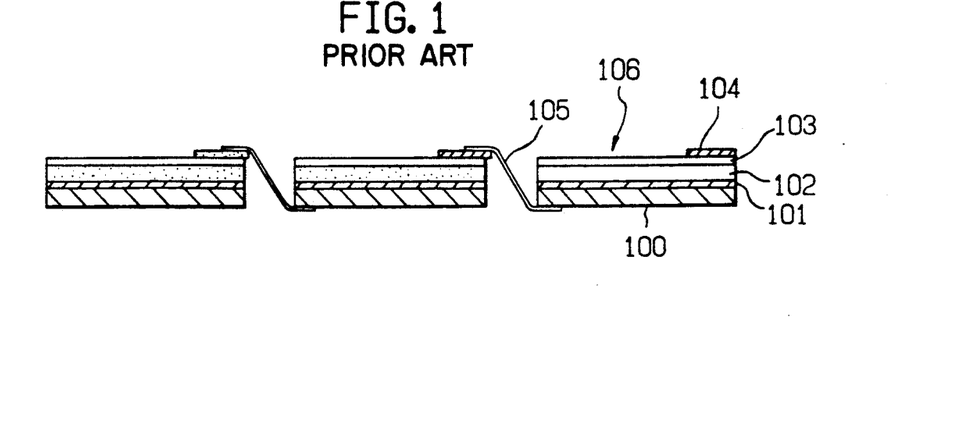
FIG. 1 is a schematic diagram of a known solar cell module comprising a plurality of solar cell elements serially interconnected by way of wiring materials.

FIG. 1 is a schematic diagram of a known solar cell module comprising a plurality of solar cell elements integrated by serially connecting them with each other by means of wiring materials. In FIG. 1, reference numeral 100 is a conductive substrate, reference numeral 101 is a lower electrode, reference numeral 102 is a semiconductor layer, reference numeral 103 is an upper electrode, reference numeral 104 is a collecting electrode, reference numeral 105 is a wiring material and reference numeral 106 is a solar cell element.

In order to prepare the foregoing solar cell module by integrating a plurality of solar cell elements, there is usually employed a method of serially connecting them using the wiring materials described above. In this method, the solar cell elements in each pair of adjacent solar cell elements are connected in series by electrically connecting the conductive substrate of one solar cell element to the collecting electrode situated on the front face of the other solar cell element with a wiring material. As a result, a so-called front face connection step and a so-called rear face connection step are employed. As mentioned, due care should be taken that the conductive substrate of the former solar cell element is electrically isolated from that of the latter solar cell element.

As can be seen, the process of preparing a solar cell module comprising a plurality of solar cell elements is complicated, and is difficult to automate.

Therefore, obtaining a multi-cell integrated solar cell module by the known process is time consuming, and the product becomes unavoidably costly.

Additionally, when preparing the known multi-cell integrated solar cell module in the above manner, since the wiring connection is made not only at the front face but also at the rear face of each of the constituent solar cell elements, the resulting multi-cell integrated solar cell module eventually exhibits a number of uneven portions caused by the wiring connection at its front face. These uneven portions often create blow holes in the protective layer subsequently formed to protect the multi-cell integrated solar cell module, or between the protective layer and the surface of the module at the time of forming the protective layer. These blow holes sometimes cause peeling of the protective layer because of the repetition of their expansion, and shrinkage due to increases and decreases in temperature, particularly when the solar cell module is used outdoors. In addition, since the refractive index is lower at the portion where the blow holes are located, light impinged on the protective layer is likely to be reflected before arrival in the solar cell element, thereby causing a reduction in the photoelectric conversion efficiency.

Further, in the case of the solar cell module of the configuration shown in FIG. 1, when a shear force occurs with respect to the arrangement interval of each solar cell element upon preparing the solar cell module, it is sometimes impossible to obtain reliable electrical connections for the solar cell elements. In particular, in the case where the interval between the respective adjacent solar cell elements is excessively narrow, a sag in the wiring material which will cause a short circuit is often formed. In the case where said interval is excessively wide, it is difficult to make a good electrical connection. When an excessively long wire is provided between the respective adjacent solar cell elements in order to obtain a solar cell module having a desired flexibility, the resulting solar cell module has an especially high probability of having a short circuit. Likewise, when an excessively short wire is provided between the adjacent solar cell elements, the resulting solar cell module becomes such that it is apt to cause breakage of the wiring or detachment of the connected portion. Therefore, the known solar cell module having the configuration shown in FIG. 1 is unsatisfactory in view of reliability and productivity.

Japanese Patent Publication No. 21827/1983 and No. 54513/1983 disclose a method of integrating a plurality of solar cell elements on a common insulating substrate by way of a masked evaporation method or the like. As a modification of this method, a method of electrically connecting the adjacent solar cell elements disposed on a common conductive substrate by connecting their metal electrodes and transparent electrodes is also known. In this method, after an insulating layer is applied to the surface of the conductive substrate, a metal electrode pattern is intermittently formed for each of the solar cell elements by way of masked evaporation.

Figure 2A:
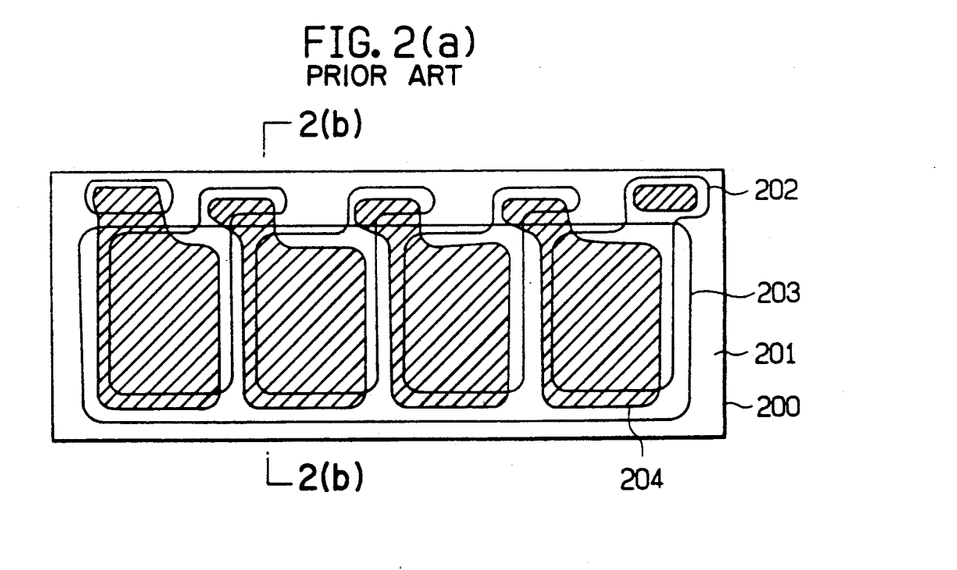
FIGS. 2(a) and 2(b) are schematic explanatory views respectively illustrating the configuration of another known solar cell module comprising a plurality of solar cell elements formed on a common substrate by way of masked evaporation.
Figure 2B:
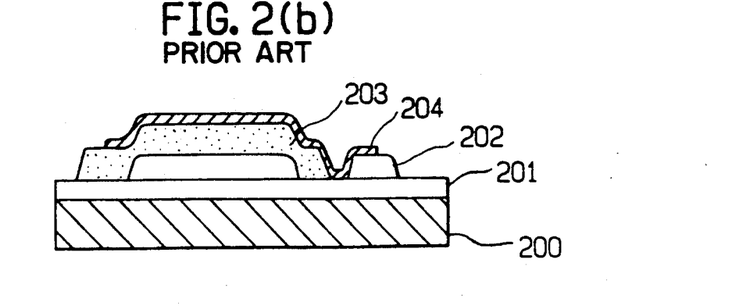

FIGS. 2(a) and 2(b) are schematic explanatory views respectively illustrating the configuration of a known solar cell module comprising a plurality of solar cell elements integrated on a common substrate by way of masked evaporation. FIG. 2(a) is a schematic planar view of this configuration, while FIG. 2(b) is a schematic sectional view taken along the line 2(b) in FIG. 2(a).

In FIGS. 2(a) and 2(b), reference numeral 200 is a conductive substrate, reference numeral 201 is an insulating layer, reference numeral 202 is a lower electrode, reference numeral 203 is a semiconductor layer, and reference numeral 204 is a transparent, upper electrode. The solar cell module illustrated in FIGS. 2(a) and 2(b) comprises a plurality of solar cell elements in which an insulating layer 201 is disposed on a conductive substrate 200, and a lower electrode 202, a semiconductor layer 203, and a transparent electrode 204 are disposed, in that order, on the insulating layer 201. In this solar cell module, the respective adjacent solar cell elements are electrically connected by electrically connecting the transparent electrode of one solar cell element to the lower electrode of the other solar cell element, such that an extended portion of the transparent electrode of the former solar cell element, situated outside the region where the semiconductor layer is positioned, is connected to an extended portion of the lower electrode of the latter solar cell element, situated outside the region where the semiconductor layer is positioned.

However, the method of arranging a plurality of solar cell elements in series on a common substrate by way of masked evaporation also exhibits problems. In particular, it is difficult to align masks as desired, the yield in the case of producing a large area solar cell module is unsatisfactory, and a variety of masks are required to meet the demands for solar cell modules of desired electric power capacity and desired shape. In addition, there are other problems in using a conductive substrate. For example, it is necessary to coat the surface of the substrate with an insulating material, but it is difficult to perform this coating without introducing pin holes which cause short circuits, thereby reducing the performance of the solar cell. Moreover, the number of processing steps is large and the method is complicated, resulting in a costly product.

SUMMARY OF THE INVENTION

The present invention is aimed at eliminating the foregoing problems, not only in the known solar cell module but also in the known method of producing the solar cell module.

Another object of the present invention is to provide an improved multi-cell integrated solar cell module which excels in weatherability and exhibits a stable, desirable photoelectric conversion efficiency over a long period of time.

A further object of the present invention is to provide an improved process which enables one to efficiently produce the improved multi-cell integrated solar cell module with a reduced production cost.

The above-described and other objects, advantages, and features of the present invention will become more apparent upon making reference to the following specification, claims and drawings.

DESCRIPTION OF THE INVENTION

The present inventors have found that when a plurality of solar cell elements, respectively formed on a conductive substrate, are arranged on an insulating surface of a base member, and when this plurality of solar cell elements are electrically connected with each other by connecting each solar cell element in a pair of adjacent solar cell elements through the transparent electrode (upper electrode) of one solar cell element and the lower electrode of the other solar cell element with the use of a conductive paste, several advantages result. More particularly, every connected portion is free of irregularities found in the known solar cell modules. Blow holes found in the known solar cell modules are not formed upon disposing a protective layer comprising a coating material such as resins, etc. on the surface of the solar cell module and, as a result, peeling of the coating (protective layer), found in the case of the known solar cell module, rarely occurs. Thus, a desirable solar cell module which exhibits a stable photoelectric conversion efficiency over a long period of time without a reduction in the output can be efficiently obtained. The present inventors have also found that, in forming the electrical connections between the respective solar cell elements arranged on the surface of a substrate by using a conductive paste, the steps of producing a solar cell module can be markedly simplified, and a desirable solar cell module can be provided with a reduced cost.

Thus, one aspect of the present invention is to provide an improved solar cell module comprising a plurality of solar cell elements, each comprising a semiconductor layer and an upper electrode, disposed in this order on a conductive surface of a substrate. This plurality of solar cell elements is spacedly disposed on a base member, with each solar cell element in a pair of adjacent solar cell elements being electrically connected with one other. An insulating material is disposed between each solar cell element in a pair of adjacent solar cell elements, and a conductor formed of a conductive paste is disposed on the insulating material, such that one end of the conductor is electrically connected to the conductive substrate surface of one solar cell element, and the other end of the conductor is electrically connected to the upper electrode of the other solar cell element. Another aspect of the present invention is to provide a process for producing the above solar cell module, which comprises the steps of:

(a) spacedly arranging a plurality of solar cell elements, each comprising a semiconductor layer and an upper electrode disposed in this order on a conductive surface of a substrate, on a base member;

(b) applying an insulating material to the space between the solar cell elements in each pair of adjacent solar cell elements to coat at least a part of that space with the insulating material; and (c) disposing a conductor formed of a conductive paste such that one end of the conductor contacts the upper electrode of one of the solar cell elements and the other end of the conductor contacts the conductive substrate surface of the other solar cell element while crossing over the insulating material.

The conductive paste used in the present invention includes so-called conductive resins, conductor pastes, cream solders and the like. It is possible to use such conductive resins and cream solders in combination as the conductive paste.

For instance, a conductive paste which excels in adhesive strength but is not sufficient in conductivity and another conductive paste which excels in conductivity but is relatively poor in adhesive strength may be used in combination to attain a desirable electrical connection, due to the synergistic effect of the different characteristics exhibited by the conductive pastes used in combination. As a result, a desirable solar cell module which has an improved flexural strength and which is free of wire breakage and contact failure is provided.

Specific examples of the conductive resin are resin compositions comprising high molecular compounds to which conductive fillers such as powdery metal, conductive carbon black or carbon fiber are added. Any of these resin compositions are made in the form of a dispersion in an organic solvent for practical use.

Specific examples of the conductive pastes are dispersions comprising fine particles of one or more of the metals Au, Ag, Pd, W, Mo, Cu, Ni and Al, dispersed in an organic solvent.

Specific examples of the cream solder are cream-like materials obtained by admixing powdery solder in a highly viscous flux.

It is possible for the wiring material formed of any of the above conductive pastes to be reinforced with a good conductor such as a metal. As the good conductor is not in this case directly used for electrical connection of the solar cell elements, it can be positioned more easily than when arranging the wiring materials for electrical connection of the solar cell elements in the prior art. In addition to this advantage, there is provided the advantage that the resulting solar cell module is further improved, particularly with respect to flexural strength, breakage of wire, and contact failure.

It is possible to form a collecting electrode for each of the plurality of solar cell elements to be integrated. This collecting electrode is capable of efficiently collecting an electromotive force as generated, and is formed on the upper electrode with the use of the conductive paste mentioned above. A significant advantage is provided that it is possible to perform the formation of the collecting electrode concurrently upon electrically connecting the plurality of solar cell elements with each other with the use of the foregoing conductive paste without causing shear force in the positional relation between the collecting electrode and the wiring portion. As is done with the wiring portion, the collecting electrode may be reinforced with a good conductor.

As above described, when performing the reinforcement using a good conductor, at least for the wiring portion formed of the foregoing conductive paste, a desirable solar cell module can be obtained which excels in flexural strength and which does not cause either wire breakage or contact failure when bent. This situation is further improved when the collecting electrode of each of the solar cell elements to be integrated is also formed of the foregoing conductive paste, and is reinforced with the use of a good conductor.

Moreover, when forming the wiring portion with the selected plural kinds of conductive pastes, and reinforcing it with a good conductor, the wiring constituting a solar cell module will exhibit improved conductivity. As a result, a desirable solar cell module which is further improved especially in flexural strength and durability and which exhibits a stable photoelectric conversion efficiency can be obtained.

In the following, the solar cell module according to the present invention will be explained in more detail, with reference to the drawings.

Figure 3A:
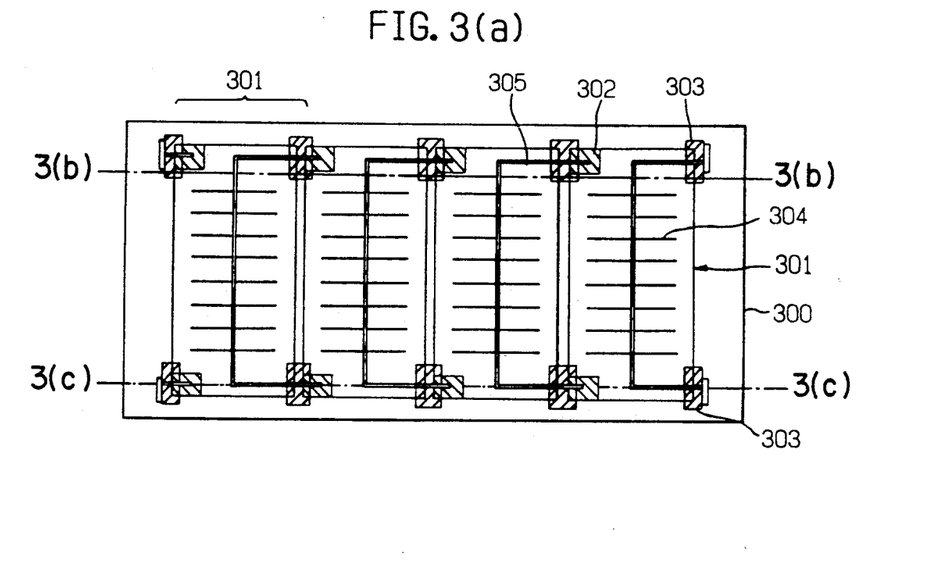
FIG. 3(a) is a schematic planar view of the configuration of one example of an integrated solar cell module according to the present invention, which comprises four solar cell elements.
Figure 3B:
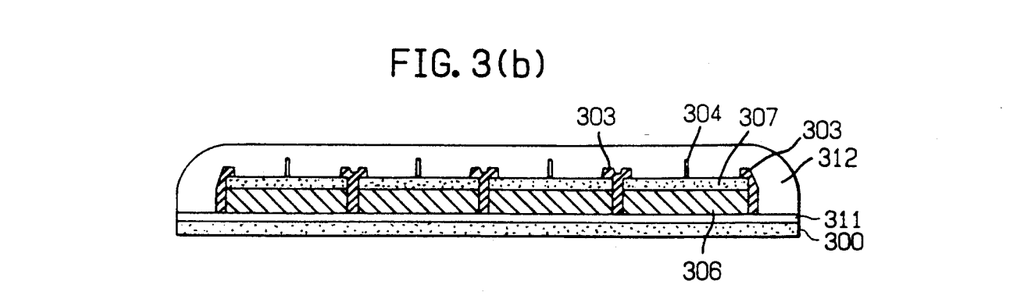
FIG. 3(b) is a schematic section view taken along the line 3(b) in FIG. 3(a).
Figure 3C:
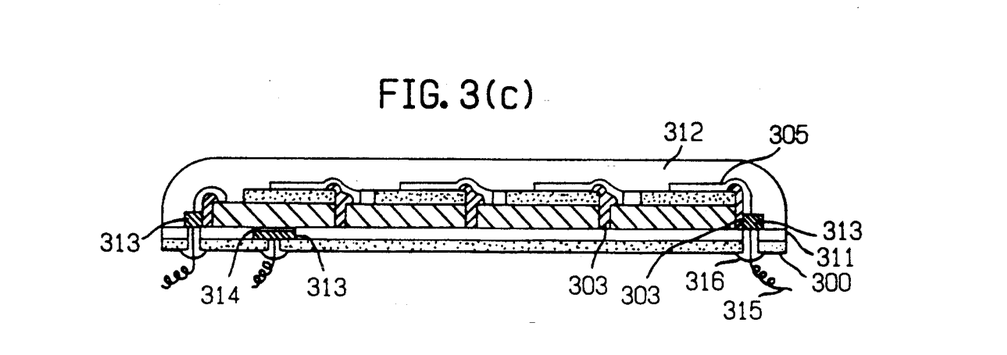
FIG. 3(c) is a schematic section view taken along the line 3(c) in FIG. 3(a).

FIGS. 3(a) through 3(c) are schematic explanatory views of the configuration of a representative example of the solar cell module according to the present invention.

Particularly, FIG. 3(a) is a schematic planar view of an example of a solar cell module according to the present invention in which four solar cell elements are wire-connected in series. FIG. 3(b), is a schematic section view taken along the line 3(b) in FIG. 3(a). FIG. 3(c) is a schematic section view taken along the line 3(c) in FIG. 3(a).

In FIGS. 3(a) through 3(c), reference numeral 300 is an insulating substrate, reference numeral 301 is a solar cell element, reference numeral 302 is an exposed portion of a conductive substrate, reference numeral 303 is an insulating material comprising, for example, an insulating resin, reference numeral 304 is a collecting electrode formed of a conductive paste, reference numeral 305 is a wiring formed of a conductive paste, reference numeral 306 is a conductive substrate, reference numeral 307 is a cell unit comprising a transparent electrode layer/semiconductor layer/metal electrode layer, reference numeral 311 is a filler, reference numeral 312 is surface protective layer, reference numeral 313 is a metal foil, reference numeral 314 is a conductive adhesive or solder, reference numeral 315 is a lead wire, and reference numeral 316 is a sealing member.

Figure 4A:
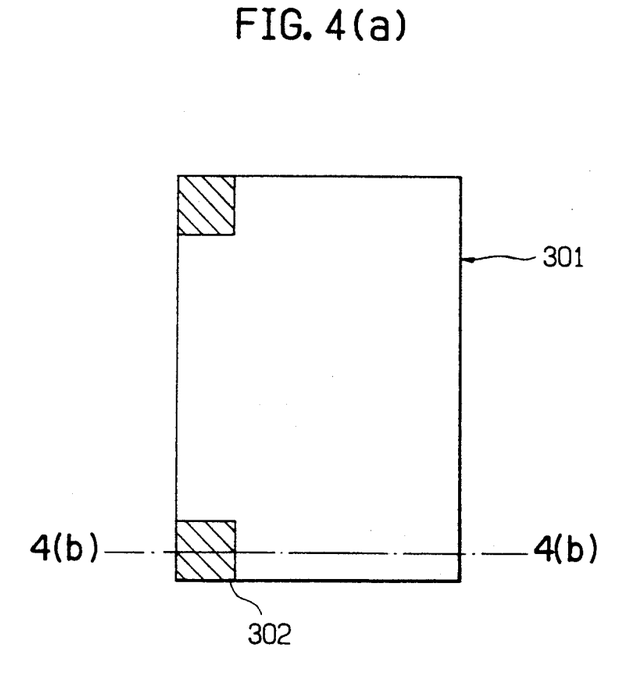
FIGS. 4(a) and 4(b) are schematic views illustrating the constitution of a solar cell element used in the solar cell module shown in FIGS. 3(a) through 3(c).
Figure 4B:
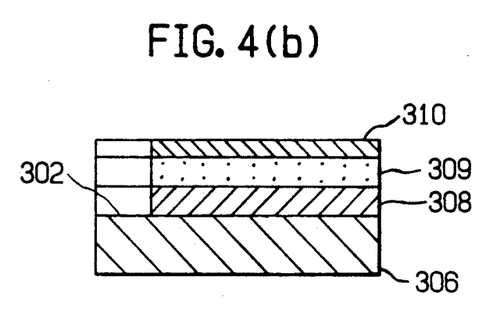

FIGS. 4(a) and 4(b) are schematic explanatory views illustrating the constitution of a representative example of the solar cell element used in the solar cell module shown in FIGS. 3(a) through 3(c). FIG. 4(a) is a schematic planar view of this example, and FIG. 4(b) is a schematic sectional view taken along the line 4(b) in FIG. 4(a).

In FIGS. 4(a) and 4(b), reference numerals 301, 302, and 306 are respectively of the same meaning as in FIGS. 3(a) through 3(c), reference numeral 308 is a metal electrode layer as a lower electrode, reference numeral 309 is a semiconductor layer, and reference numeral 310 is a transparent electrode as an upper electrode.

Now, explanation will be given of the solar cell module according to the present invention by way of a representative example, with reference to FIGS. 3(a) to 3(b) and FIGS. 4(a) to 4(b).

The solar cell element 301 to be used in the solar cell module according to the present invention comprises, for example, a metal electrode layer 308, a semiconductor layer 309, and a transparent electrode 310 disposed in this order on a conductive substrate 306, wherein the metal electrode layer 308 is electrically connected to the conductive substrate 306. Reference numeral 302 represents an exposed portion of the conductive substrate 306 on which the metal electrode layer, semiconductor layer and transparent electrode are not disposed (see FIGS. 4(a) and 4(b)). In the solar cell module of this example, each solar cell element in a pair of adjacent solar cell elements is electrically connected to the other element through two of such exposed portions. Thus, each of the constituent solar cell elements 301 is provided with two such exposed portions, and each solar cell element is electrically connected to the adjacent element via the two exposed portions 302 of each of the constituent solar cell elements 301.

In the configuration of the solar cell module shown in FIGS. 3(a) through 3(c), four of the foregoing solar cell elements 301 are spacedly arranged in the same direction, and are electrically connected with each other via the two exposed portions 302 of each of the four constituent solar cell elements 301 in the following manner.

That is, in this example, the wiring 305 for electrically connecting each solar cell element in a pair of adjacent solar cell elements 301 and the collecting electrode 304 of each of the constituent solar cell elements 301 are respectively formed of the foregoing conductive paste. Particularly, the exposed portion 302 of the conductive substrate 306 of one solar cell element 301 is electrically connected to the transparent electrode 310 of the solar cell element 301 next to it through the wiring formed of the foregoing conductive paste. The wiring extends therefrom to connect to the collecting electrode 304, which is comb-like in shape, for example, in the instant solar cell element.

There is disposed an insulating material 303 between the solar cell elements in each pair of adjacent solar cell elements 301 in order to prevent the occurrence of an undesirable electrical connection between the adjacent solar cell elements when arranging the wiring formed of the foregoing conductive paste. Particularly, the insulating material 303 is disposed not only to prevent the occurrence of an electrical connection between the conductive substrates 306 of the adjacent solar cell elements 301, but also to prevent the occurrence of a short circuit between the transparent electrode 310 and the conductive substrate 306 in each of the solar cell elements 301 upon applying the foregoing conductive paste to dispose the wiring 305 between each solar cell element in a pair of adjacent solar cell elements 301.

In a preferred embodiment, the insulating material 303 is disposed such that it reaches to the upper face of the transparent electrode 310. In this case, the above purposes can be effectively attained, and undesirable contact of the wiring 305 formed of the foregoing conductive paste with the semiconductor layer 309 can be prevented as desired.

As for the conductive substrate 306 of each of the constituent solar cell elements, it is possible to use any member as long as it has a conductive surface on which a cell comprising a photoelectric conversion semiconductor layer can be disposed.

The solar cell element 301 need not always be provided with the metal electrode layer 308, in the case where the substrate 306 has a conductive surface.

In the above-mentioned case, the exposed conductive substrate portion 302 (see FIG. 4(b)) is free of the metal electrode layer 308, but the metal electrode layer 308 may be left on the surface thereof. In the case where the exposed conductive substrate portion 302 is free of the metal electrode layer 308, the portion where the metal electrode layer 308 is removed functions as a barrier, preventing electrical connection between the semiconductor layer 309 and the wiring upon forming the wiring with the foregoing conductive paste. In view of this, in a preferred embodiment, it is desirable that the exposed conductive substrate portion 302 be free of the metal electrode layer 308.

Figure 5:
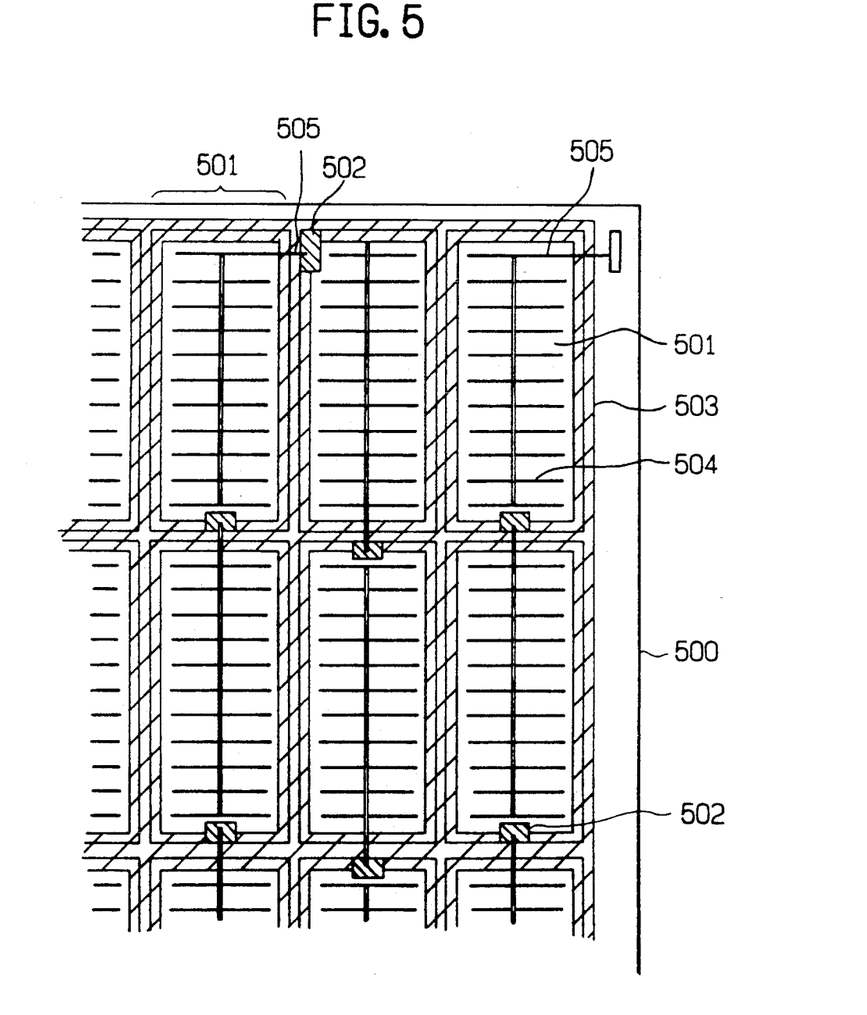
FIG. 5 is a schematic view illustrating the configuration of another example of an integrated solar cell module according to the present invention, which comprises a plurality of solar cell elements.

Shown in FIG. 5 is a configuration of another example of the solar cell module according to the present invention. The solar cell module shown in FIG. 5 comprises a plurality of solar cell elements respectively disposed on a conductive substrate and having a collecting electrode, wherein the plurality of solar cell elements are electrically connected in series by way of wirings respectively formed of the foregoing conductive paste.

In FIG. 5, reference numeral 500 is an insulating base member, reference numeral 501 is a transparent electrode, reference numeral 502 is an exposed portion of a conductive substrate, reference numeral 503 is an insulating material comprising an insulating resin, reference numeral 504 is a collecting electrode formed of the foregoing conductive paste, and reference numeral 505 is a wiring formed of the foregoing conductive paste. The basic constitution of the solar cell module shown in FIG. 5 is the same as that of the former solar cell module. Therefore, detailed explanation of this solar cell module is omitted.

The above-mentioned solar cell modules of the present invention are of a series type. The solar cell module according to the present invention may be configured to be of a parallel type.

In the following, a representative process of producing a solar cell module according to the present invention which has the configuration shown in FIG. 3 is given.

Firstly, a substrate having a conductive surface is provided. On the conductive surface of the substrate a metal electrode layer, a semiconductor layer and a transparent electrode layer are sequentially formed in the conventional manner, to thereby obtain a solar cell element having the layer structure shown in FIG. 4(b). This solar cell element is then cut to obtain a plurality of solar cell elements respectively having a predetermined size. For each of the solar cell elements thus obtained, a part of the cell (excluding the substrate) is cut to form a solar cell element of the configuration shown in FIGS.

4(a) and 4(b), having an exposed conductive portion 302 of the substrate 306. In this case, it is possible to leave the metal electrode layer as it is on the conductive surface of the exposed substrate portion.

Separately, as the insulating member 300, an insulating member having a surface coated with a filler 311 is provided. A hole is formed in the insulating member 300 where an output terminal is to be installed. A metal foil 313, to be the output terminal, is provided to cover the hole. The surface of the metal foil 313, over which the conductive substrate 306 of the solar cell element is to be situated, is applied with a conductive adhesive or solder 314.

Then, a predetermined number (four in the case of FIG. 3) of the above solar cell elements having the exposed conductive substrate portion 302 are spacedly positioned on the filler 311 disposed on the insulating base member 300. Thereafter, the end faces of the respective solar cell elements are partly covered by an insulating material 303. It is possible to cover the end faces of each of the solar cell elements prior to their arrangement on the insulating base member 300. A collecting electrode 304 and a wiring 305 for series electrical connection of each of the solar cell elements are successively formed using the foregoing conductive paste. These collecting electrodes and/or these wirings formed of the foregoing conductive paste may be reinforced with a good conductor as described above.

Further, after a surface protective layer 312 is formed, a lead wire 315 extending from the output terminal 313 is provided, and the opening through which the lead wire 315 is fed is sealed with the use of a sealing material 316. Thus, a solar cell module as desired is obtained.

In the above solar cell module, the insulating material 303 is disposed for the purpose of preventing the occurrence of an undesirable contact between the wiring 305 and the conductive substrate 306, thereby causing electrical continuity between them.

In the above process for producing a solar cell module of the present invention, in order to connect a plurality of solar cell elements in series, the collecting electrode of one solar cell element is electrically connected to an exposed conductive substrate portion of another solar cell element. In an alternative process, serial connection of a plurality of solar cell elements in order to obtain a solar cell module of the present invention may be carried out in the following manner. That is, a region comprising a part of a transparent electrode layer which is divided into a banded state is provided to an end portion of one solar cell element. This region is electrically connected to the collecting electrode of the solar cell element situated next to it by forming a wiring with the use of the foregoing conductive paste. Then, the wiring formed at the region is fused by irradiation of a laser beam to provide a junction with a lower electrode. In this way, a plurality of solar cell elements are integrated to obtain the solar cell module of the present invention.

In the present invention, according to any of the above-mentioned processes, a desirable large area solar cell module can be efficiently produced with a high yield without employing the complicated steps of the prior art and without encountering the foregoing problem of irregularities caused by wiring a plurality of solar cell elements in the prior art. Hence, according to the present invention, a desirable solar cell module product with a reduced cost can be provided.

For the conductive resin used as the conductive paste, those comprising fine particles of Ag, Au, Cu, Ni, carbon or the like dispersed together with a polymeric binder may be used. Specific examples of the polymeric binder are polyester resin, epoxy resin, acrylic resin, alkyd resin, polyvinyl acetate, rubber, urethane resin, phenolic resin, etc. As previously described, it is possible to use a combination of a conductive resin and a cream solder as the conductive paste. Specific examples of such combination are laminates comprising a solder, such as In-based solder, laminated on any of the above-mentioned conductive resins, laminates comprising any of the above-mentioned conductive resins and a solder containing the same metal contained in the conductive resin which is laminated on the conductive resin, or the like. Among these laminates, a laminate comprising an In-based solder laminated on an Ag-containing conductive resin and a laminate comprising an Ag-containing solder laminated on an Ag-containing conductive resin are the most desirable.

The wiring and/or the collecting electrode comprising the foregoing conductive paste in the solar cell module of the present invention can be formed by applying the foregoing conductive paste so as to provide a predetermined pattern with a screen printer or a dispenser, and subjecting the resultant to solidification, thereby forming a wiring or a collecting electrode in a desired state. In the case of using the conductive resin as the conductive paste, the foregoing resin composition is used in the form of a dispersion, and the resin composition is applied in the above manner and is subjected to heat treatment to cure the polymeric binder contained therein, thereby solidifying it. In the case of using the cream-like solder as the conductive paste, the foregoing cream-like solder is applied in the above manner and is subjected to heat to fuse the solder contained therein. The resultant is cooled, thereby solidifying it.

In the above, when using a screen printer, it is necessary to provide various printing plates in order to cope with the demand for various patterns. However, this situation is far simpler than that in conducting evaporation or etching. When using a dispenser, it is easy to cope with this demand since NC control can be carried out as desired.

Specific examples of the good conductor used for reinforcing the wiring or the collecting electrode in the present invention are foil-like shaped or linear shaped members of Cu, Al, Ni, Ag, etc. and carbon fiber. In the case of reinforcing the wiring or the collecting electrode formed of the foregoing conductive paste using such foil-like or linear shaped metal, the foil-like or linear shaped metal is adhered to the surface of the wiring or the collecting electrode with the use of a solder.

Specific examples of the insulating material used in the present invention are polyester resin, polyesterimide resin, polyimide resin, polyurethane resin, silicone resin, epoxy resin, acrylic resin, etc. These insulating materials can be applied by a conventional spray coating method, a conventional screen printing method, or other conventional methods such as a coating method using a dispenser. They can also be applied by a method in which a film of any of the above-mentioned insulating resins having a pressure-sensitive adhesive disposed thereon is applied through the pressure sensitive adhesive.

Specific examples of the filler used in the present invention are ethylene-vinyl acetate copolymer, polyvinyl butyral, silicone resin, etc.

Specific examples of the insulating base member used in the present invention are a metal plate of Al, etc., coated with a butyl rubber, insulating resin, etc., a film of a fluorine-containing plastic such as polyvinylidene fluoride, etc., and an aluminum foil laminated with a resin film of polyester, polyethylene, polypropylene, etc.

It is necessary that sufficient light be allowed to transmit through the surface protective layer into the solar cell element in the present invention. The surface protective layer must have a sufficient resistance against ultraviolet rays and ozone, and must have a sufficient weatherability. In a preferred embodiment, the surface protective layer comprises a double-layer structured layer having a fluorine-containing plastic film disposed on an ethylene-vinyl acetate copolymer film (the fluorine-containing film being situated in the side from which light is impinged). In an alternative, the surface protective layer may be formed with a coating material made of a silicone resin, fluorine-containing plastic, etc.

Specific examples of the sealing material used in the solar cell module of the present invention are silicone resin, butyl rubber, etc. through which water does not or hardly permeates.

Specific examples of the conductive substrate for the solar cell element used in the solar cell module of the present invention include stainless steel, Al, Cu, etc., and a carbon sheet.

The metal electrode of the solar cell element used in the solar cell module of the present invention is desirably formed of elements such as Ti, Tr, Mo, W, Al, Ag, Ni, etc. The metal electrode may be formed by way of a resistance heating evaporation method, an electron beam evaporation method, or a sputtering method.

The semiconductor layer forming the photoelectric conversion member in the solar cell element used in the solar cell module of the present invention may be comprised of any of the known semiconductor materials generally used in thin-film solar cell elements. For instance, the semiconductor layer of the solar cell element may be comprised of a pin junction amorphous silicon layer, a pin junction polycrystal silicon layer, or a semiconductor layer comprising $CuInSe_2/CdS$. The pin junction amorphous silicon layer may be formed by a conventional plasma CVD method wherein a film-forming raw material gas such as, silane gas is subjected to a plasma discharge. The pin junction polycrystal silicon layer may be formed, for example, by a conventional film-forming method wherein a film is formed from a fused silicon. The semiconductor layer comprising $CuInSe_2/CdS$ may be formed by an electron beam evaporation method, a sputtering method, or an electrode-position method.

The transparent electrode of the solar cell element used in the solar cell module of the present invention may be formed of $In_2O_3$, $SnO_2$, $In_2O-SnO_2$, $ZnO$, $TiO_2$, $Cd_2SnO_4$, crystalline semiconductor materials doped with an impurity in a high content, etc. The transparent electrode comprising such material may be formed by a resistance heating evaporation method, an electron beam evaporation method, a sputtering method, a spray coating method, a CVD method, or an impurity diffusion method.

DESCRIPTION OF THE PREFERRED EMBODIMENTS

The advantages of the present invention are now described in more detail with reference to the following example, provided for illustrative purpose only, and not intended to limit the scope of the present invention.

EXAMPLE

A solar cell module of the configuration shown in FIGS. 3(a) through 3(b) was prepared, with each of the solar cell elements having the constitution shown in FIGS. 4(a) and 4(b).

Firstly, a stainless steel plate 0.2 mm in thickness having a clean surface was provided as the conductive substrate 306 for a solar cell element to be prepared.

A 5000 Å thick aluminum film and a 5000 Å thick ZnO film were then deposited as the lower electrode layer 308 on the clean surface of the stainless steel plate by a conventional sputtering method, while maintaining the substrate at 350° C.

Then, in accordance with a conventional plasma CVD method, while maintaining the substrate at 250° C., on the ZnO film were successively formed a 150 Å thick n-type a-Si layer using $SiH_4$ gas, $PH_3$ gas, and $H_2$ gas; a 4000 Å thick i-type a-Si layer using $SiH_4$ gas and $H_2$ gas; and a 100 Å thick p-type a-Si layer using $SiH_4$ gas, $BF_3$ gas, and $H_2$ gas, thereby forming a triple-layered photoelectric conversion layer as the pin junction semiconductor layer 309. Thereafter, on the semiconductor layer 309, a 700 Å thick $In_2O-SnO_2$ film (that is, ITO film) was formed as the transparent electrode 310 in accordance with a conventional resistance heating evaporation method, wherein In and Sn were evaporated under an atmosphere comprising $O_2$ while maintaining the substrate at 200° C.

In order to obtain a plurality of solar cell elements respectively of the same predetermined size, the ITO film of the resultant was partly etched. This etching was carried out by printing etching paste, obtained by mixing $FeCl_3$, HCl, starch and glycerin, to form a plurality of solar cell element patterns with 0.8 mm line width using a screen printing machine (product of FUJIOKA SEISAKUSHO Kabushiki Kaisha). The patterns formed were subjected to heat treatment at 130° C./minute in an infrared furnace, followed by washing with water, and then drying. Then, for each of the solar cell elements to be obtained, the ITO film 310, the pin junction semiconductor layer 309, and the metal electrode 308 respectively positioned where the wiring connection portion is to be situated were removed by means of a grinder to expose a conductive surface on the substrate 306. A YAG laser beam (50 μm in diameter) was irradiated on each of the portions where the ITO film was removed to cut those portions, thereby obtaining a plurality of solar cell elements 301, each of 60 mm in width. The semiconductor layer 309 and the lower electrode layer 308 of each of the solar cell elements were removed by means of a microgrinder to form an exposed stainless substrate portion 302 (see FIG. 4) for each of the solar cell elements. A butyl rubber plate of 2 mm in thickness was separately provided as the base member 300. An EVA sheet 100 μm in thickness was laminated on the butyl rubber plate as the filler 311. A hole was made in the resultant laminate as an output port for a lead wire. A copper foil 313 applied with an In-based solder was placed on the output port. On the resultant, four of the above-obtained solar cell elements were spacedly arranged such that they did not contact each other. Each of the solar cell elements thus arranged was fixed with a tape made of polyimide. Thereafter, an Ag-paste (viscosity: 70 PaS, product of Du Pont Co., Ltd.) was applied using a dispenser (product of MUSASHI Engineering Co., Ltd.), followed by drying at 180° C. for 30 minutes, thereby forming a series wiring pattern 305 and a collecting electrode pattern 304 for each of the solar cell elements. Successively, a cream-like Ag-containing solder containing a flux of Alpha Flux No. 100 and comprising Sn:62%/Pb:36%/Ag:2% (viscosity: 300 PaS, product of Alpha Metals Inc.) was applied on each of the wiring and collecting electrode patterns, followed by heat treatment. Then, a YAG laser beam was irradiated on the series wiring portion formed at the exposed stainless steel substrate portion 302 of each of the solar cell elements 301, thereby strengthening the adhesion thereof.

Finally, a laminate comprising a polyvinylidene fluoride film sheet 50 $\mu$m in thickness, laminated on an EVA sheet 100 $\mu$m in thickness as the protective layer 312, was laminated on the surface of the multi-cell integrated solar cell module by a vacuum laminating device. A lead wire 315 was connected to the output terminal 313 with the use of a conventional solder. Then, the output port was sealed by a silicone resin. Thus, there was obtained a solar cell module of the present invention.

The measured open circuit voltage (Voc) under irradiation of AM 1.5 light (100 mW/cm$^2$) of the resultant solar cell module was 3.1 V.

The resultant solar cell module was then evaluated by a temperature and moisture cycle test and a bending test. The temperature and moisture cycle test was carried out for ten cycles under the following conditions: temperature $-40°$ C. to 85° C.; relative humidity 85%; and one cycle 6 hours. Thereafter, the solar cell module was observed to determine if removal of the laminate occurred. The degree of reduction in the output power was also measured. It was found that any removal which occurred for the laminate and the amount of the reduction in the output power was within 5%.

The bending test was carried out in a manner such that the solar cell module was wound around a cylinder 10 cm in diameter through its front face five times and through its rear face five times. After this, the degree of reduction in the output power was measured. It was found that the amount of the reduction in the output power was within 10%.

In view of the above results, it was recognized that the solar cell module obtained exhibits the stable solar cell characteristics required for a practical solar cell module.

Independently, the above procedures of producing a solar cell module were repeated, except that the pin junction amorphous silicon semiconductor layer was replaced by a pin junction polycrystal silicon semiconductor layer and a semiconductor layer comprising CuInSe$_2$/CdS, to thereby obtain two different kinds of solar cell modules. Each of the resultant solar cell modules were evaluated in the same manner as in the above case. Good results similar to those above were obtained in both cases.

In accordance with the above process for producing a solar cell module of the present invention, because of employing a step wherein the collecting electrode and the connection wiring are concurrently formed on the same side, the production process is not complicated but simple. Additionally, wiring material can be saved. Further, the process of the present invention is free of the foregoing problem found in the prior art concerning the incorporation of blow holes at the time of forming the surface protective layer. Thus, a high quality solar cell module can be obtained with a high yield. Accordingly, the present invention makes it possible to provide a desirable solar cell module with a reduced cost.

Additionally, it is obvious that the foregoing pin junction semiconductor layer 309 can be replaced by another appropriate photoelectric conversion semiconductor layer such as: multi-layer stacked semiconductor layers, e.g. layers having a pin/pin, pin/pin/pin, pn/pn, and pn/pn/pn; amorphous silicon carbide semiconductor layers instead of the amorphous silicon semiconductor layer; or amorphous silicon germanium semiconductor layers instead of the amorphous silicon semiconductor layer.

COMPARATIVE EXAMPLE

There was prepared a solar cell module by repeating the procedures of the above Example, except that instead of the serial wiring pattern 305, a Cu-foil of 100 $\mu$m in thickness was connected to the collecting electrode 304 and to the exposed stainless steel portion 302 with the use of a conventional solder.

The resultant solar cell module was evaluated in the same manner as in the above Example. The temperature and moisture cycle test showed occurrence of laminate removal at the end portion of the Cu-foil. The amount of reduction in the output power was more than 35%. Also, the amount of reduction in the output power after the bending test was more than 70%.

What we claim is:

1. An improved solar cell module, comprising a plurality of solar cell elements, each solar cell element comprising a metal electrode layer, a semiconductor layer, and a transparent and conductive electrode layer disposed in this order on a conductive surface of a substrate, said plurality of solar cell elements being electrically connected in series with each other, characterized in that the solar cell elements in said plurality of solar cell elements comprise a plurality of separate solar cell elements that have been prepared in advance and are spacedly arranged on an insulating surface of a common base member, wherein an insulating material is disposed in a space between solar cell elements in each pair of adjacent solar cell elements, an electrode wiring comprising a conductive paste and a foil-like or linear-shaped member of metal is disposed on said insulating material such that one end of said electrode wiring is electrically connected to the transparent and conductive electrode layer of one solar cell element in each pair of adjacent solar cell elements, and a remaining end of said electrode wiring is electrically connected to a given exposed portion of the conductive substrate surface of the other solar element in each pair of adjacent solar cell elements, and wherein the given exposed portion is an extended portion of the conductive substrate surface, and the given exposed portion is free of any of the metal electrode layer, the semiconductor layer, and the transparent and conductive electrode layer.

2. A solar cell module according to claim 1, wherein said metal of said foil-like or linear-shaped member is one of Cu, Al, Ni, and Ag.

3. A solar cell module according to claim 1, wherein each of said plurality of solar cell elements further comprises a collecting electrode disposed on the transparent and conductive electrode layer, said collecting electrode being electrically connected to said electrode wiring.

4. A solar cell module according to claim 3, wherein said collecting electrode comprises a conductive paste.

5. A solar cell module according to claim 3, wherein said collecting electrode further comprises a foil-like or linear-shaped member of a metal that is one of Cu, Al, Ni, and Ag.

6. A process for producing a solar cell module comprising a plurality of solar cell elements, each comprising a metal electrode layer, a semiconductor layer, and a transparent and conductive electrode layer disposed in this order on a conductive surface of a substrate, said plurality of solar cell elements being electrically connected in series with each other, said process comprising the steps of:

(a) providing in advance a plurality of separate solar cell elements, each comprising a metal electrode layer, a semiconductor layer, and a transparent and conductive electrode layer disposed in this order on a conductive surface of a substrate;

(b) removing a part of a layered body of each of the solar cell elements, the layered body comprising the metal electrode layer, the semiconductor layer, and the transparent and conductive electrode layer stacked in this order on the conductive surface of the substrate, such that a given portion of the conductive substrate surface is exposed to form an exposed conductive surface portion;

(c) spacedly arranging the solar cell elements, each having the exposed conductive surface portion, on a common, electrically insulating surface base member;

(d) disposing an electrically insulating material in a space between the solar cell elements in each pair of adjacent solar cell elements spacedly arranged on the common, electrically insulating base member; and (e) applying an electrode wiring comprising a conductive paste and a foil-like or linear-shaped member of metal such that one end of said electrode wiring contacts with the transparent and conductive electrode layer of one solar cell element in each pair of adjacent solar cell elements and the other end of said conductive paste contacts with the exposed conductive substrate surface portion of the other solar cell element in each pair of adjacent solar cells elements while crossing over and covering at least part of the surface of the insulating material disposed in the step (d).

7. The process according to claim 6, wherein the conductive paste comprises one or more members selected from the group consisting of conductive resin and cream solder.

8. The process according to claim 6, wherein the conductive paste is also applied onto portions of the transparent and conductive electrode layer of each of the solar cell elements.

* * * * *